United States Patent
Kuijsten

[19]

[11] Patent Number: 5,884,066
[45] Date of Patent: *Mar. 16, 1999

[54] METHOD AND APPARATUS FOR A TRACE BUFFER IN AN EMULATION SYSTEM

[75] Inventor: Han Kuijsten, Oakland, Calif.

[73] Assignee: Quickturn Design Systems, Inc., Mountainview, Calif.

[*] Notice: This patent issued on a continued prosecution application filed under 37 CFR 1.53(d), and is subject to the twenty year patent term provisions of 35 U.S.C. 154(a)(2).

The term of this patent shall not extend beyond the expiration date of Pat. No. 5,680,583.

[21] Appl. No.: 855,908

[22] Filed: May 14, 1997

Related U.S. Application Data

[63] Continuation of Ser. No. 855,908, May 13, 1997, which is a continuation of Ser. No. 197,430, Feb. 16, 1994, Pat. No. 5,680,563.

[51] Int. Cl.⁶ .................................................. G06F 13/00
[52] U.S. Cl. ............................................................ 395/500
[58] Field of Search ........................... 395/500; 364/488, 364/489, 490, 491, 578

[56] References Cited

U.S. PATENT DOCUMENTS

| 3,106,698 | 10/1963 | Unger ..................................... 340/172.5 |
| 3,287,702 | 11/1966 | Borck, Jr. et al. ................... 340/172.5 |

(List continued on next page.)

FOREIGN PATENT DOCUMENTS

| 0217291 | 9/1986 | European Pat. Off. ........ G06F 12/60 |
| 0 372 833 A2 | 6/1990 | European Pat. Off. . |
| 0453171A2 | 10/1991 | European Pat. Off. . |
| 0777 180 A2 | 6/1997 | European Pat. Off. . |
| 58-147236 | 9/1983 | Japan .......................... H03K 19/177 |
| 58-147237 | 9/1983 | Japan .......................... H03K 19/177 |
| 58-205870 | 11/1983 | Japan . |
| 59-161839 | 9/1984 | Japan . |
| 01154251 | 6/1989 | Japan . |
| 1444084 | 7/1976 | United Kingdom . |
| 218220 | 9/1986 | United Kingdom . |
| 2180382 | 3/1987 | United Kingdom . |
| WO 96/13902 | 5/1996 | WIPO . |
| WO 96/28788 | 9/1996 | WIPO . |

OTHER PUBLICATIONS

Agrawal, "Virtual Wires : A Technology for Massive Multi–FPGA Systems," Virtual Machine Works, pp. 1–24. no date.
Goering, "Emulation for the Masses," Electronic Engineering Times, p. 63. Jan. 01, 1996.
SimExpress Specifications, Mentor Graphics, SimExpress Hardware Emulator. no date.
Maliniak, "Pin Multiplexing Yields Low–Cost Logic Emulation,"Electronic Design, pp. 65–66. Jan. 1996.
McFarland et al., "The High–Level Synthesis of Digital Systems," Proceedings of the IEEE, vol. 78, No. 2, pp. 301–316, Feb. 1990.
"The Homogenous Computational Medium; New Technology For Computation", Concurrent Logic Inc., Jan. 26, 1987.
Spandorfer, "Synthesis of Logic Functions on an Array of Integrated Circuits", Contract Report AFCRI–6–6–298, Oct. 31, 1965.

(List continued on next page.)

*Primary Examiner*—Kevin J. Teska
*Assistant Examiner*—Leigh Marie Garbowski
*Attorney, Agent, or Firm*—Lyon & Lyon LLP

[57] ABSTRACT

A tracing method and apparatus for a digital emulation system. The invention allows trace information to be obtained during the emulation of a digital circuit that includes a clock signal. Input signal states are sensed and stored each clock cycle. The internal state of the emulated digital circuit is also stored. By using the stored input signal states and internal states, the states of other signals in the emulated digital circuit are derived.

7 Claims, 9 Drawing Sheets

U.S. PATENT DOCUMENTS

| | | | |
|---|---|---|---|
| 3,287,703 | 11/1966 | Slotnick | 340/172.5 |
| 3,473,160 | 10/1969 | Wahlstrom | 340/172.5 |
| 3,810,577 | 5/1974 | Drescher et al. | 340/172.5 |
| 3,928,730 | 12/1975 | Agaard et al. | 379/275 |
| 3,955,180 | 5/1976 | Hirtle | 340/172.5 |
| 4,020,469 | 4/1977 | Manning | 364/200 |
| 4,032,899 | 6/1977 | Jenny et al. | 364/200 |
| 4,306,286 | 12/1981 | Cocke et al. | 364/200 |
| 4,315,315 | 2/1982 | Kossiakoff | 364/300 |
| 4,357,678 | 11/1982 | Davis | 364/900 |
| 4,386,403 | 5/1983 | Hsieh et al. | 364/300 |
| 4,404,635 | 9/1983 | Flaker | 364/481 |
| 4,459,694 | 7/1984 | Ueno et al. | 371/21 |
| 4,488,354 | 12/1984 | Chan et al. | 29/830 |
| 4,503,386 | 3/1985 | DasGupta et al. | 324/73 |
| 4,510,602 | 4/1985 | Engdahl et al. | 371/21 |
| 4,524,240 | 6/1985 | Stock et al. | 174/685 |
| 4,525,789 | 7/1985 | Kemper et al. | 364/481 |
| 4,527,115 | 7/1985 | Mehrotra et al. | 324/73 |
| 4,527,249 | 7/1985 | Van Brunt | 364/578 |
| 4,539,564 | 9/1985 | Smithson | 340/825.79 |
| 4,541,071 | 9/1985 | Ohmori | 364/900 |
| 4,577,276 | 3/1986 | Dunlop et al. | 364/491 |
| 4,578,761 | 3/1986 | Gray | 364/481 |
| 4,583,169 | 4/1986 | Cooledge | 364/300 |
| 4,587,625 | 5/1986 | Marino et al. | 364/578 |
| 4,593,363 | 6/1986 | Burstein et al. | 364/491 |
| 4,600,846 | 7/1986 | Burrows | 307/465 |
| 4,612,618 | 9/1986 | Pryor et al. | 364/900 |
| 4,613,940 | 9/1986 | Shenton et al. | 364/490 |
| 4,621,339 | 11/1986 | Wagner et al. | 364/900 |
| 4,642,487 | 2/1987 | Carter | 307/465 |
| 4,656,580 | 4/1987 | Hitchcock et al. | 364/200 |
| 4,656,592 | 4/1987 | Spaanenburg et al. | 364/490 |
| 4,674,089 | 6/1987 | Poret et al. | 371/25 |
| 4,675,832 | 6/1987 | Robinson et al. | 364/521 |
| 4,695,740 | 9/1987 | Carter | 307/242 |
| 4,695,950 | 9/1987 | Brandt et al. | 364/200 |
| 4,695,968 | 9/1987 | Sullivan, II et al. | 364/200 |
| 4,695,999 | 9/1987 | Lebizay | 370/58 |
| 4,697,241 | 9/1987 | Lavi | 364/488 |
| 4,700,187 | 10/1987 | Furtek | 340/825.83 |
| 4,706,216 | 11/1987 | Carter | 365/94 |
| 4,713,557 | 12/1987 | Carter | 307/242 |
| 4,722,084 | 1/1988 | Morton | 371/9 |
| 4,725,835 | 2/1988 | Schreiner et al. | 340/825.83 |
| 4,725,971 | 2/1988 | Doshi et al. | 364/578 |
| 4,736,338 | 4/1988 | Saxe et al. | 364/578 |
| 4,740,919 | 4/1988 | Elmer | 365/104 |
| 4,744,084 | 5/1988 | Beck et al. | 371/23 |
| 4,747,102 | 5/1988 | Funatsu | 371/23 |
| 4,752,887 | 6/1988 | Kuwahara | 364/491 |
| 4,758,745 | 7/1988 | El Gamal et al. | 307/465 |
| 4,758,985 | 7/1988 | Carter | 365/94 |
| 4,761,768 | 8/1988 | Turner et al. | 365/201 |
| 4,766,569 | 8/1988 | Turner et al. | 365/185 |
| 4,768,196 | 8/1988 | Jou et al. | 371/25 |
| 4,769,817 | 9/1988 | Krohn et al. | 371/23 |
| 4,777,606 | 10/1988 | Fournier | 364/491 |
| 4,782,440 | 11/1988 | Nomizu et al. | 364/200 |
| 4,782,461 | 11/1988 | Mick et al. | 364/900 |
| 4,786,904 | 11/1988 | Graham et al. | 340/825.83 |
| 4,787,061 | 11/1988 | Nei et al. | 364/900 |
| 4,787,062 | 11/1988 | Nei et al. | 364/900 |
| 4,791,602 | 12/1988 | Resnick | 364/900 |
| 4,803,636 | 2/1989 | Nishiyama et al. | 364/491 |
| 4,811,214 | 3/1989 | Nosenchuck et al. | 364/200 |
| 4,815,003 | 3/1989 | Patatunda et al. | 364/491 |
| 4,819,150 | 4/1989 | Jennings et al. | 364/200 |
| 4,823,276 | 4/1989 | Hiwatashi | 364/491 |
| 4,827,427 | 5/1989 | Hyduke | 364/488 |
| 4,829,202 | 5/1989 | Austin | 307/465 |
| 4,835,705 | 5/1989 | Fujino et al. | 364/491 |
| 4,845,633 | 7/1989 | Furtek | 364/490 |
| 4,849,904 | 7/1989 | Aipperspach et al. | 364/489 |
| 4,849,928 | 7/1989 | Hauck et al. | 395/500 |
| 4,854,039 | 8/1989 | Wendt | 29/832 |
| 4,855,669 | 8/1989 | Mahoney | 324/73 |
| 4,862,347 | 8/1989 | Rudy | 364/200 |
| 4,864,165 | 9/1989 | Hoberman et al. | 307/467 |
| 4,868,419 | 9/1989 | Austin | 307/440 |
| 4,870,302 | 9/1989 | Freeman | 340/465 |
| 4,873,459 | 10/1989 | El Gamal et al. | 307/465 |
| 4,876,466 | 10/1989 | Kondou et al. | 307/465 |
| 4,879,646 | 11/1989 | Iwasaki et al. | 364/200 |
| 4,882,690 | 11/1989 | Shinsha et al. | 364/490 |
| 4,899,273 | 2/1990 | Omoda et al. | 364/200 |
| 4,901,259 | 2/1990 | Watkins | 364/578 |
| 4,901,260 | 2/1990 | Lubachevsky | 364/578 |
| 4,908,772 | 3/1990 | Chi | 364/491 |
| 4,914,612 | 4/1990 | Beece et al. | 364/578 |
| 4,918,440 | 4/1990 | Furtek | 340/825.83 |
| 4,918,594 | 4/1990 | Onizuka | 364/208 |
| 4,922,432 | 5/1990 | Kobayashi et al. | 364/490 |
| 4,924,429 | 5/1990 | Kurashita et al. | 364/578 |
| 4,931,946 | 6/1990 | Ravindra et al. | 364/490 |
| 4,935,734 | 6/1990 | Austin | 340/825.83 |
| 4,937,827 | 6/1990 | Beck et al. | 371/23 |
| 4,942,536 | 7/1990 | Watanabe et al. | 364/490 |
| 4,942,615 | 7/1990 | Hirose | 364/578 |
| 4,945,503 | 7/1990 | Takasaki | 364/578 |
| 4,949,275 | 8/1990 | Nonaka . | |
| 4,951,220 | 8/1990 | Ramacher et al. | 364/488 |
| 4,958,324 | 9/1990 | Devin | 365/201 |
| 4,965,739 | 10/1990 | Ng | 364/491 |
| 4,972,334 | 11/1990 | Yamabe et al. | 364/200 |
| 4,972,372 | 11/1990 | Ueno | 365/201 |
| 5,003,487 | 3/1991 | Drumm et al. | 364/489 |
| 5,023,775 | 6/1991 | Poret | 364/200 |
| 5,031,129 | 7/1991 | Powell et al. | 364/717 |
| 5,036,473 | 7/1991 | Butts et al. | 364/489 |
| 5,041,986 | 8/1991 | Tanishita | 364/489 |
| 5,046,017 | 9/1991 | Yuyama et al. | 364/491 |
| 5,051,938 | 9/1991 | Hyduke | 364/578 |
| 5,053,980 | 10/1991 | Kanazawa | 364/578 |
| 5,068,812 | 11/1991 | Schaefer et al. | 364/578 |
| 5,081,602 | 1/1992 | Glover | 364/578 |
| 5,083,083 | 1/1992 | El-Ayat et al. | 324/158 |
| 5,084,824 | 1/1992 | Lam et al. | 364/490 |
| 5,093,920 | 3/1992 | Agrawal et al. | 395/800 |
| 5,109,353 | 4/1992 | Sample et al. | 364/578 |
| 5,114,353 | 5/1992 | Sample | 439/65 |
| 5,126,966 | 6/1992 | Hafeman et al. | 364/500 |
| 5,128,871 | 7/1992 | Schmitz | 364/490 |
| 5,140,526 | 8/1992 | McDermith et al. | 364/488 |
| 5,172,011 | 12/1992 | Leuthold et al. | 307/272.2 |
| 5,224,055 | 6/1993 | Grundy et al. | 364/488 |
| 5,224,056 | 6/1993 | Chene et al. | 364/490 |
| 5,231,588 | 7/1993 | Agrawal et al. | 364/489 |
| 5,231,589 | 7/1993 | Itoh et al. | 364/490 |
| 5,233,539 | 8/1993 | Agrawal et al. | 364/489 |
| 5,253,363 | 10/1993 | Hyman | 395/800 |
| 5,259,006 | 11/1993 | Price et al. | 375/107 |
| 5,276,854 | 1/1994 | Court et al. | 395/500 |
| 5,321,828 | 6/1994 | Phillips et al. | 395/500 |
| 5,329,470 | 7/1994 | Sample et al. | 364/578 |
| 5,329,471 | 7/1994 | Swoboda et al. | 364/578 |
| 5,331,571 | 7/1994 | Arnoff et al. | 364/490 |
| 5,339,262 | 8/1994 | Rostoker et al. | 364/578 |
| 5,345,580 | 9/1994 | Tamaru et al. | 395/500 |
| 5,352,123 | 10/1994 | Sample et al. | 439/61 |
| 5,377,123 | 12/1994 | Hyman | 364/489 |

| | | | |
|---|---|---|---|
| 5,386,550 | 1/1995 | Yumioka et al. | 395/575 |
| 5,396,498 | 3/1995 | Lestrat et al. | 371/3 |
| 5,425,036 | 6/1995 | Liu et al. | 371/23 |
| 5,437,037 | 7/1995 | Furuichi | 395/700 |
| 5,448,496 | 9/1995 | Butts et al. | 364/489 |
| 5,448,522 | 9/1995 | Huang | 365/189.04 |
| 5,452,231 | 9/1995 | Butts et al. | 364/489 |
| 5,452,239 | 9/1995 | Dai et al. | 364/578 |
| 5,475,624 | 12/1995 | West | 364/578 |
| 5,475,830 | 12/1995 | Chen et al. | 395/500 |
| 5,477,475 | 12/1995 | Sample et al. | 364/578 |
| 5,479,355 | 12/1995 | Hyduke | 364/489 |
| 5,530,958 | 6/1996 | Agarwal et al. | 395/403 |
| 5,544,069 | 8/1996 | Mohsen | 364/489 |
| 5,546,562 | 8/1996 | Patel | 395/500 |
| 5,551,013 | 8/1996 | Beausoleil et al. | 395/500 |
| 5,563,829 | 10/1996 | Huang | 365/189.04 |
| 5,572,710 | 11/1996 | Asano et al. | 395/500 |
| 5,574,388 | 11/1996 | Barbier et al. | 326/41 |
| 5,596,742 | 1/1997 | Agrawal et al. | 395/500 |
| 5,612,891 | 3/1997 | Butts et al. | 364/489 |
| 5,649,176 | 7/1997 | Selvidge et al. | 395/551 |
| 5,659,716 | 8/1997 | Selvidge et al. | 395/500 |
| 5,680,583 | 10/1997 | Kuijsten | 395/500 |

FOREIGN PATENT DOCUMENTS

J. Babb, R. Tessier, A.Agarwal, "Virtual Wires; Overcoming Pin Limitation". no date, no p. #.

T. Payne; "Automated Partitioning of Hierarchically Specified Digital Systems"; May 1981, no p. #.

Tham, "Parallel Processing CAD Applications", IEEE Design & Test of Computer, Oct. 1987, pp. 13–17.

Agrawal, et al. "MARS: A Multiprocessor–Based Programmable Accelerator", IEEE Design & Test Computers, Oct. 1987, pp. 28–36.

R.Tessier, J.Babb, M.Dahl, S.Hanono and A.Agarwal, "The Virtual wires Emulation System; A Gate Efficient ASIC Prototyping Environment", ACM Workshop of FPGA's (FPGA '94) Feb. 94. no. p. #.

Manning "An Approach to Highly Integrated, Computer-–Maintained Cellular Arrays", IEEE Transactions on Computers, vol. C–26, Jun. 1977, pp. 536–552.

Manning, "Automatic Test, Configuration, and Repair of Cellular Arrays", Doctoral Thesis MAC TR–151 (MIT), Jun. 1975. no p. #.

M.Dahl,J.Babb,R.Tessler,S.Hanono,D.Hoki and A.Agarwal, "Emulation of a Sparcle Microprocessor With the MIT, Virtual Wires Emulation System", IEEE Workshop on FPGAs for Custom Computing Machines '94 (FCCM '94), Apr. 1994. no p. #.

Ravenscroft, "Function Language Extractor and Boolean Generator " IEEE 1986, pp. 120–123.

Shoup, "Programmable Cellular Logic Arrays," Doctoral Thesis (Carnegie–Mellon University; DARPA contract No. 144620–67–C0058), Mar. 1970. no p. #.

Shoup, "Programmable Cellular Logic," undated, pp. 27–28 I.

Wynn, "In–Circuit Emulation for ASIC–Based Designs" VLSI Systems Design, Oct. 1986, pp. 38–45.

Minnick, "Survey of Microcellular Research," Stanford Research Institute Project 5876 (Contract AF 19(628)–5828), Jul. 1966.

"VDHL Mixed–Level Fault Simulator"; IKOS Systems Mar. 26, 1997. no author, no p. #.

Siegel "The Design of a Logic Simulation Accelerator", Oct. 1985 pp. 76–86 VLSI Systems Design.

Minnick, "A Programmable Cellular Array," undated, pp. 25–26.

Minnick, "Cutpoint Cellular Logic," IEEE Transactions on Electronic Comuters, Dec. 1964, pp. 685–698.

Jump, et al. "Microprogrammed Arrays," IEEE Tranactions on Computers, vol. C–21, No.9, Sep. 1972, pp. 974–984.

J.W. Babb, "Virtual Wires: Overcomming Pin Limitations in FPGA–based Logic Emulation", Masters Thesis, Massachusette Institute of Technology, Departmment of Electrical Engineering and Computer Science, No. 1993; Also available as MIT/LCS Technical Report TR–586. no p. #.

Gentile, et al. "Design of Switches for Self–Reconfiguring VLSO Array Structures," Microprocessing Microprogramming, North–Holland, 1984, pp. 99–108.

Sami, et al. "Reconfigurable Architectures for VLSI Processing Arrays," AFIPS Conference Proceedings, 1983 National Computer Conference, May 16–19, 1983, pp. 565–577.

Beece et al. "The IBM Engineering Verification Engine," $25^{th}$ ACM/IEEE Design Automation Conference, Paper 17.1, 1988 pp. 218–224.

Pfister, "The Yorktown Simulation Engine: Introduction," $19^{th}$ Design Automation Conference, Paper 7.1 1982, pp. 51–54.

Denneau, "The Yorktown Simulation Engine," $19^{th}$ Design Automation Conference, Paper 7.2, 1982, pp. 55–59.

Kronstadt, et al., "Software Support For the Yorktown Simulation Engine," $19^{th}$ Design Automation Conference, Paper 7.3, 1982, pp. 60–64.

Koike, et al., "HAL: A High–Speed Logic Simulation Machine," IEEE Design & Test, Oct. 1985, pp. 61–73.

"VirtuaLogic SLI Emulation System"; IKOS Systems Mar. 26, 1997. no author, no p. #.

"Logic Emulation For The Masses Arrives"; IKOS Systems Mar. 26, 1997. no author, no p. #.

Shear, "Tools help you retain the advantages of using breadboards in gate–array design," EDN, Mar. 18, 1987, pp. 81–88.

McClure, "PLD Breadboarding of Gate Array Designs," VLSI Systems Design, Feb. 1987, pp. 36–41.

Anderson, "Restructurable VLSI Program" Report No. ESD–TR–80–192 (DARPA Contract No. F19628–80–C–0002), Mar. 31, 1980. no p. #.

Xilinx, First Edition, "The Programmable Gate Array Design Handbook," 1986, pp. 1–1 to 4–33.

Odaware, "Partitioning and Placement Technique for CMOS Gate Arrays," IEEE Transactions on Computer Aided Deisgn, May 1987, pp. 355–363.

Beresford, "An Emulator for CMOS ASICS," VLSI Systems Design, May 4, 1987, p. 8.

Mentor Graphics Corp., "Gate Station User's Manual," 1987, (excerpts). no p. #.

Mentor Graphics Corp., "Technology Definition Format Reference Manual," 1987 (excerpts). no p. #.

Chen, "Fault–Tolerant Wafer Scale Architectures Using Large Crossbar Switch Arrays," excerpt from Jesshope, et al., Wafer Scale Integration, A.Hilger, 1986, pp. 113–124.

Kung, "Why Systolic Architectures?," Computer, Jan. 1982, pp. 37–46.

Hedlund, "Wafer Scale Integration of Parallel Processors," Doctoral Thesis (Purdue University; Office of Naval Research Contracts N00014–80–K–0816 & N00014–81–K–0360) 1982. no p. #.

Fiduccia, et al. "A Linear–Time Heuristic For Improving Network Partitions," IEEE Design Automation Conference, 1982, pp. 175–181.

Trickey, "Flamel: A High–Level Hardware Compiler," IEEE Transaction on Computer–Aided Design, Mar., 1987, pp. 259–269.

Schweikert, "A Proper Model for the Partitioning of Electrical Circuits," Bell Telephone Laboratories, Inc. Murray Hill, N.J., pp. 57–62. no date.

"Partitioning of PLA Logic," IBM TDM, vol. 28, No. 6, Nov. 1985, pp. 2332–2333. no author.

Goossens, et al., "A Computer–Aided Design Methodology for Mapping DSP–Algorithms onto Custom Multi–Processing Architectures," IEEE 1986, pp. 924–925.

Hedlund, et al., "Systolic Architectures–A Wafer Scale Approach," IEEE, 1984, pp. 604–610.

"IKOS Systems to Acquire Virtual Machineworks"; IKOS Systems Mar. 26, 1997. no author, no date.

Choi, et al., "Fault Diagnosis of Switches in Wafer–Scale Arrays," IEEE, 1986, pp. 292–295.

Runner, "Synthesizing Ada's Ideal machine Mate," VLSI Systems Design, Oct., 1988, pp. 30–39.

Wagner, "The Boolean Vector Machine," ACM SIGARCH, 1983, pp. 59–66.

Preparata, "The Cube–Connected Cycles: A Versatile Network for Parallel Computation," Communications of the ACM, May, 1981, pp. 300–309.

Clos, "A Study of Non–Blocking Switching Networks," The Bell System Technical Journal, Mar. 1953, pp. 126–144.

Masson, "A Sampler of Circuit Switching Networks" Computer, Jun. 1979, pp. 32–48.

"Plus Logic FPGA2020 Field Programmable Gate Array" Brochure by Plus Logic, San Jose, CA, pp. 1–13. no date no author.

Schmitz, "Emulation of VLSI Devices Using LCAs," VLSI systems Design, May 20, 1987, pp. 54–62.

Abramovici, et al., "A Logic Simulation Macine," $19^{th}$ Design Automation Conference, Paper 7.4, 1982, pp. 65–73.

Hennessy, "Partitioning Programmable Logic Arrays," undated, pp. 180–181.

DeMicheli, et al., "Topological Partitioning of Programmable Logic Arrays," undated, pp. 182–183.

Hou, et al., "A High Level Synthesis Tool For Systolic Designs," IEEE, 1988, pp. 665–673.

"Gate Station Reference Manual," Mentor Graphics Corp., 1987 (excerpts). no author, no p. #.

Dussault, et al., "A High Level Synthesis Tool for MOS Chip Design," $21^{st}$ Design Automation conference, 1984, IEEE, pp. 308–314.

DeMicheli, et al., "HERCULES—a System for High Level Synthesis," $25^{th}$ ACM/IEEE Design Automation Conference, 1988, pp. 483–488.

J.Babb, A.Agrawal "More Virtual Wires", article from Webmaster@cag.lcs.mit.edu Feb. 3, 1995. no p. #.

R. Tessier "More Virtual Pictures", article from Webmaster@cag.lcs.mit.edu Feb. 3, 1995. no p. #.

Donnell, "Corsspoint Switch: A PLD Approach," Digital Design, Jul. 1986 pp. 40–44.

Beresford, "Hard Facts, Soft ASICS," VLSI Systems Design, Dec. 1986, p. 8.

"ERA60100 Electrically Reconfigurable Array–ERA," Brochure by Plessey Semiconductors, Apr. 1989. no author no p. #.

Snyder, "Introduction to the Configurable, Highly Parallel Computer," Report CSD–TR–351, Office of Naval Research Contracts N00014–80–K–0816 and N00014–8–1–K–0360, Nov. 1980. no p. #.

Paleski, et al., "Logic Partitioning for Minimizing Gate Arrays," IEEE Transactions on Computer–Aided Design of Integrated Circuits and Systems, vol. CAD–2, No. 2, Apr. 1983. no p. #.

Chin, et al. "A Dynamically Reconfigurable Interconnect Chip"; IEEE International Solid State Circuits conference 1987, pp. 276–277 & 425.

McCarthy, "Partitioning Adapts Large State Machines PLDs," EDN, Sep. 17, 1987, pp. 163–166.

Geoffrey Mott, et al. "The Utility of Hardware Accelerators in the Design Environment," Oct. 1985, pp. 62–71, VLSI Systems Design.

"The Programmable Gate Array Data Book"; Xilinx Inc. 1988: no author, no p. #.

Kautz, et al., "Cellular Interconnection Arrays," IEEE Transactions on Computers, vol. C–17, NO. 5, May 1968, pp. 443–451.

Kautz, et al. "Cellular Logic–in–Memory Arrays," IEEE Transaction on Computers, vol. C–18, No. 8, Aug. 1969, pp. 719–727.

M.Dahl, "An Implementation of the Virtual Wires Interconnect Scheme", Masters Thesis, Massachusetts Institute of Technology, Department of Electrical Engineering and Computer Science, Feb. 1994; Also available as MIT/LCS Technical Report. no p. #.

T.J. Bauer, "Thje Design of an Efficient Hardware Subroutine Protocal for FPGAs", Masters Thesis, Massachusetts Institute of Technology, Department of Electrical Engineering and Computer Science, May. 1994; Also available as MIT/LCS Technical Report. no p. #.

Wirbel, "Plus Logic Rethinks PLD Approach," newspaper article, not dated, one page.

Pardner Wynn, "In–Circuit Emulation for ASIC–Based Designs," Oct. 1986, pp. 38–46, VLSI Systems Design.

Nick Schmits, "Emulation of VLSI Devices Using LACs," May 20, 1987, pp. 54–63, VLSI Systems Design.

Prathima Agrawal, "A Hardware Logic Simulation System," Jan. 1980, pp. 19–29, IEEE Transactions on Computer Aided Design, vol. 9, No. 1.

Munoz, et al., "Automatic Partitioning of Programmable Logic Devices, " VLSI Systems Design, Oct. 1987, pp. 74–86.

Feng, "A Survey of Interconnection Networks, " Computer, Dec. 1981, pp. 12–27.

Chapter 36, "Switching Networks and Traffic Concepts," Reference Data for Radio Engineers, Howard W. Sams & Co., 1981, pp. 36–1 to 36–16.

S.Hanono, "Inner View Hardware Debugger; A Logic Analysis Tool for the Virtual Wires Emulation System", Masters Thesis, Massachusetts Institute of Technology, Department of Electrical Engineering and Computer Science, Jan. 1995; Also available as MIT/LCS Technical Report. no p. #.

Alfred E. Dunlop, et al., "A Procedure for Placement of Standard–Cell VLSI Circuits," 1985 IEEE, pp. 92–98.

Ching–Wei Yeh, et al., "A General Purpose Multiple Way Partitioning Algorithm," pp. Q15400–Q15405. no date.

Balakrishman Krishnamurthy, "An Improved Min–Cut Algorithm for Partitioning LVSI Networks," May 1984, pp. 438–446, IEEE Transactions on Computers, vol. C–33, No. 5.

Andrew B. Kahng, "Fast Hypergraph Partition," pp. 662–666, 26$^{th}$ ACM/IEEE Design Automation Conference. no date.

Mark R. Hartoog, "Analysis of Placement Procedures for VLSI Standard Cell Layout," pp. 314–319, 23$^{rd}$ Design Automation Conference. no date.

Jorn Garbers, et al., "Findings Clusters in VLSI Circuits," 1990 IEEE, pp. 520–523.

Yen–Chuen Wei, et al. "Towards Efficient Hierarchial Designs by Ratio Cut Partitioning," 1989 IEEE. no p. #.

Yen–Chuen Wie, et al., "Ration Cut Partitioning for Hierarchial Designs," pp. 1–24. no date.

Wolfgang Rosenstiel, "Optimizations in High Level Synthesis," 1986, pp. 347–352, Microprocessing and Microprogramming.

Malik, Sharad, et al., "Combining Multi–Level Decomposition and Topological Partitioning for PLAS," IEEE 1987, pp. 112–115.

Bradsma, et al., "The Hardware Simulator: A Tool for Evaluating Computer Systems," IEEE Transactions on Computers, Jan., 1977, pp. 68–72.

Horstmann, "Macro Test Circuit Generation," IBM TDM vol. 18, No. 12, May 1976 pp. 4023–4029.

IMB TDM "Testing Multiple Discrete Software Components by Connecting Real and Simulated Hardware Components," vol. 30, No. 4, Sep., 1987, pp. 1844–1845.

William S. Carter, et al., "A User Programmable Reconfigurable Logic Array," 1986 IEEE, pp. 233–235, Custom Integrated Circuits Conference.

R.Ayres, "Silicon Compilation a Hierarchical Use of PLAs", Xerox Corporation, pp. 314–326. no date.

Borriello; "High–Level Synthesis: Current Status and Future Directions" IEEE 1988, pp. 477–482.

McFarland; "Tutorial on High–Leval Synthesis" 25$^{th}$ ACM/IEEE Desgin Automation Conference, 1988, pp. 330–336.

J. Babb, "Virtual Wires; Overcoming Pin Limitations in FPGA–based Logic Emulators", Massachusetts Institute of Tehcnology, Student Workshop on Scalable Computing, Aug. 4, 1993. no p. #.

R. Tessier, J.Babb, M.Dahl, S.Hanono and D.Hoki, "The Virtual Wires Emulation System: A Gate–Efficient ASIC Prototyping Environment", MIT, Student Workshop on Scalable Computing Jul. 21–22, 1994. no p. #.

D.Jones; "A Time–Multiplexed FPGA Architecture For Logic Emulation"; 1995. no p. #.

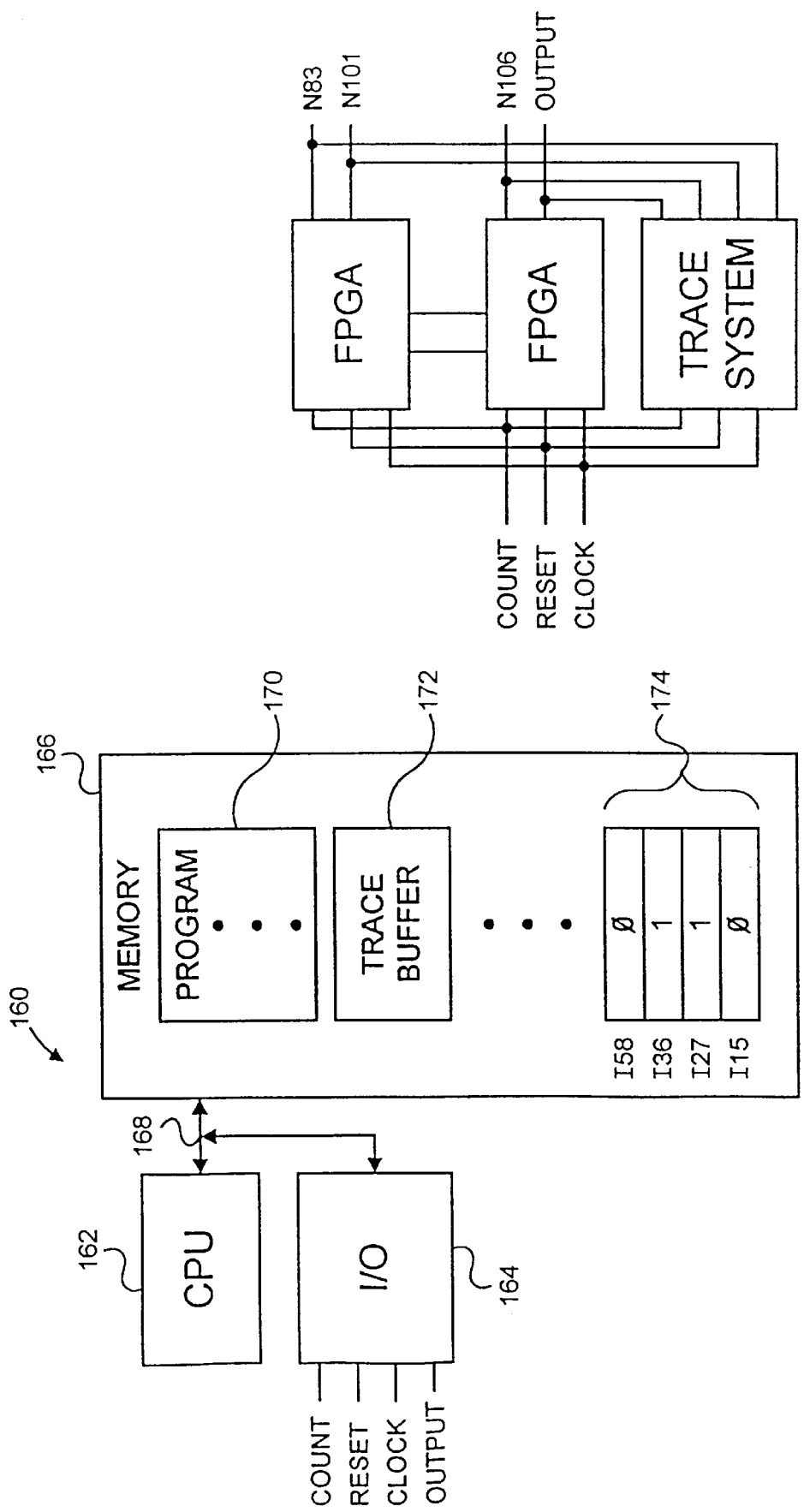

Trace Buffer Values

| clock cycle | n-clocks | input states | internal states | temporary buffer | input to trace buffer |
|---|---|---|---|---|---|
| 0 | 1 | 01 | 0000 | xxx- - | 01x |
| 1 | 2 | 10 | 0000 | xx- - - | 10x |
| 2 | 3 | 10 | 0001 | x- - - - | 10x |
| 3 | 0 | 10 | 0010 | 0010 | 100 |
| 4 | 1 | 10 | 0011 | 010- - | 100 |
| 5 | 2 | 10 | 0100 | 10- - - | 101 |
| 6 | 3 | 10 | 0101 | 0- - - - | 100 |
| 7 | 0 | 10 | 0110 | 0110 | 100 |
| 8 | 1 | 10 | 0111 | 110- - | 101 |
| 9 | 2 | 00 | 1000 | 10- - - | 001 |
| 10 | 3 | 00 | 1000 | 0- - - - | 000 |
| 11 | 0 | 01 | 1000 | 1000 | 011 |
| 12 | 1 | 01 | 0000 | 000- - | 010 |
| 13 | 2 | 01 | 0000 | 00- - - | 010 |

Fig. 5B

METHOD AND APPARATUS FOR A TRACE BUFFER IN AN EMULATION SYSTEM

This application is a Continued Prosecution application of Ser. No. 08/855,908 filed on May 13, 1997, which is a continuation of Ser. No. 08/197,430 filed Feb. 16, 1994 now U.S. Pat. No. 5,680,563.

FIELD OF THE INVENTION

This invention relates generally to digital emulation systems and specifically to the use of trace buffers in digital emulation systems.

BACKGROUND OF THE INVENTION

Emulation systems typically use a computer, or other digital system, to simulate, or "emulate", a digital circuit being designed or developed. The emulation system is designed to mimic the logical operation of the digital circuit. This means that the signal inputs given to the emulator will result in the emulator outputting signals identical to that which would be output when the emulated circuit is given the same input signals.

During emulation, a trace buffer is used as an aid in analyzing and debugging the circuit under development. The trace buffer stores a record of changing states of signal inputs, signal outputs and internal signals of the circuit being emulated. In a digital synchronous system the states are stored once per clock cycle. The use of a trace buffer allows the circuit designer to emulate the circuit under development and operate the circuit up to a point where an error condition occurs. The trace buffer may continue to collect signal states but at some point tracing is stopped to allow the human designer to examine the record of signal states to determine what events caused the error. Alternatively, the operation of the circuit may be permitted to continue past the error condition so that the designer has a record of events that occur after the error condition. In this way, the record of signal states provided by the trace buffer aids the designer in developing a digital circuit. Emulation methods in use today provide other analytical tools to aid the designer in debugging the circuit.

A problem arises in traditional emulation methods where the size and speed of the digital circuit being designed introduces problems of efficiency and accuracy in emulating the circuit.

In order for a circuit under design to be accurately emulated the emulation of the circuit must run at, or close to, the circuit's target operating speed. This is because the circuit being emulated must often interface with external circuitry operating at real time speeds. Also, certain problems in the design of the circuit may only be apparent when the emulation is run at target operating speeds.

An emulation method in use today uses field programmable gate arrays (FPGAs) to emulate a circuit. With this method, a logic description of the circuit is prepared by the designer. The logic description is input to a compiler that determines how to implement the logic description in the FPGAs. Assuming two or more FPGAs are used the design is broken down into subsystems where each subsystem can be implemented on one of the FPGAs. This step is critical since the number of pins on an FPGA package often restricts the types of signals that can later be traced. For example, typical numbers of input/output (I/O) pins available on an FPGA package range from 64 to 144. Invariably these pins are in short supply because of interfacing requirements for the FPGA. This causes problems when the designer must decide which signals internal to the FPGA to make available on I/O pins so that the signals can be traced during emulation.

Once a trace has been performed, the signals in the trace buffer, corresponding to signals in the compiled FPGA circuits, are correlated to signals in the original circuit under development.

A circuit may also be emulated in a computer system. The computer system may be a general purpose computer or a dedicated computer system whose architecture is designed especially for emulating complex digital circuits. In general, for a general purpose computer, the circuit emulation is carried out mostly by software. For a dedicated computer system, the more specialized the architecture, the more the circuit design is emulated by the hardware rather than software. In either computer emulation system, the problems of specifying which signals to trace and correlating the traced signals to signals in the original design still exist.

An additional problem where substantial portions of the emulation are accomplished via software is that the emulation is very slow compared to the target operating speed of the circuit. Tracing, or capturing signal states, will often be performed by software. However, this has the drawback that the emulation is slowed down even more. Where tracing is done substantially by hardware the size of the trace buffer limits the number of signals that may be traced and the number of clock cycles during which a signal may be traced in any given emulation run.

The emulation, tracing and correlation steps may be repeated many times while the designer attempts to isolate and solve a problem with the circuit design. Often, the designer must make a choice as to which signals to trace at any given emulation run. If it turns out that not all of the necessary signals have been traced the designer must go back and perform another trace that may involve manually connecting and disconnecting signal paths to, e.g., an external logic analyzer, in order to capture the missing signal. Even more burdensome where FPGAs are used, a signal that the designer is interested in may not be provided on an FPGA pin. In this case, the designer must go back to the compile step in order to specify that the desired signal must be connected to an FPGA pin. Each repetition of the compiling, emulating, tracing and correlating steps adds to the development time of the circuit and increases the cost. Therefore, a system is needed which eliminates the problems of the emulation systems described above.

SUMMARY OF THE INVENTION

The present invention overcomes the problems of the prior art as discussed above.

The present invention provides tracing system for tracing the operation of a digital circuit wherein the digital circuit includes storage elements such as flipflops, registers and memory. The tracing system includes a digital system for emulating the operation of a digital circuit; means for representing the digital circuit within the digital system; input tracing means for sensing and storing the states of the inputs of the digital circuit every clock cycle; state tracing means for sensing and storing the states of storage elements every n clock cycles; analysis means coupled to the digital system for deriving the state of one or more internal signals based on the stored internal states and the stored input states and output means for outputting the states of the internal signals.

BRIEF DESCRIPTION OF THE DRAWINGS

FIG. 3A illustrates a first implementation of a circuit design in an emulation system;

FIG. 3B illustrates a second implementation of a circuit design in an emulation system;

FIG. 5B is an illustration of a trace buffer that contains the states of signals in FIG. 5A.

DETAILED DESCRIPTION OF A PREFERRED EMBODIMENT

Figure 1:
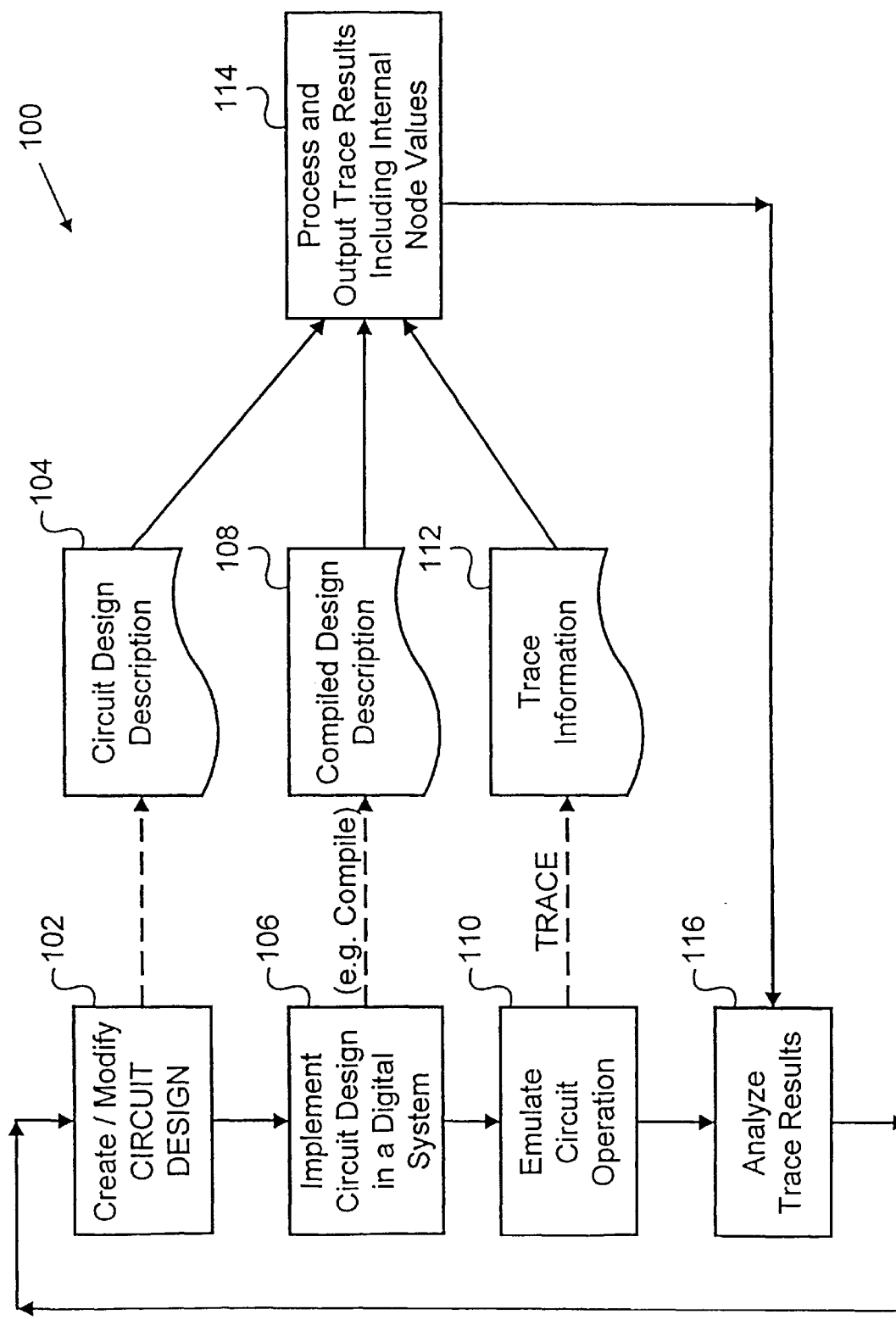
FIG. 1 is a block diagram showing the basic steps in emulating and tracing a circuit design.

FIG. 1 is a block diagram showing the basic steps in emulating and tracing a circuit design. In FIG. 1, basic steps 102, 106, 110 and 116 are part of a design/debugging process 100 with which the trace method and apparatus of the present invention is used.

At step 102 of FIG. 1, the circuit design is first created by a human designer. This is typically a schematic diagram of the circuit in either electronic or printed form. The circuit may be designed for fabrication, ultimately, on a printed circuit board with discrete components, on a single integrated circuit chip, etc. File 104 is an electronic representation of the circuit design description. This may include a record of components and interconnections (i.e., a netlist). At step 106, the circuit design is implemented in a digital system. The digital system can be one or more FPGAs, a breadboard design, a general purpose computer, custom multiprocessor array, etc.

A typical way to implement circuit design description 104 in a digital system is to compile the circuit design into compiled design description 108. Compiled design description 108 describes a circuit that performs the same logic functions as circuit design description 104, with respect to the inputs and outputs of circuit design description 104, but usually implements the logic functions in a different way as dictated by the constraints of the digital system being used for the emulation. An example would be where a circuit design description is compiled to be implemented on one or more FPGAs. A circuit design description can also be compiled to be implemented on a general purpose digital computer. In a preferred embodiment, the present invention uses a circuit design description that is compiled to execute on a custom multiprocessor array. Any suitable implementation of the circuit design into an emulation system is within the scope of the present invention.

At step 110 of FIG. 1, the implemented circuit design is emulated by operating the digital system. During emulation, trace information is obtained and used to create trace information file 112. Traditionally, the human designer makes decisions as to which signals to trace. The designer would often be limited in the number of signals that could be traced, both by the digital system performing the emulation and by the tracing system. Also, the decision as to which signals to trace can require considerable thought and, where custom hardware devices such as FPGAs or application specific integrated circuits (ASICs) are used to implement the circuit design, the physical connections required to set up the trace are time-consuming. The present invention, as described below, eliminates these tasks from the designer's work thereby providing a more efficient tracing mechanism.

Box 114 of FIG. 1 is the automated step in which the circuit design description 104, compiled design description 108 and trace information 112 files are processed to provide results in human-readable form to the designer. Trace information file 112 contains the state of selected signals in the emulated circuit during operation of the circuit at step 110. By using the traced states, these signals are related to signals in the compiled design description 108. By working "backwards" from the compiled design description, the signal states are, in turn, related to signals in circuit design description 104. Thus, the designer is presented with signal states at various nodes within the circuit according to the designer's original circuit design. This conveniently relates signal states in the emulation to the circuit design that the designer is most familiar with.

At step 116, the designer analyzes the trace results. Step 102 is again performed in order to make any necessary changes to the circuit design to correct for errors and steps 106, 110, 116 and 102 are repeated until the design is working properly. Thus, FIG. 1 illustrates the basic steps of design/debugging process 100 used by the designer to design and debug a digital circuit with the aid of a circuit emulator and a tracing system.

Figure 2A:
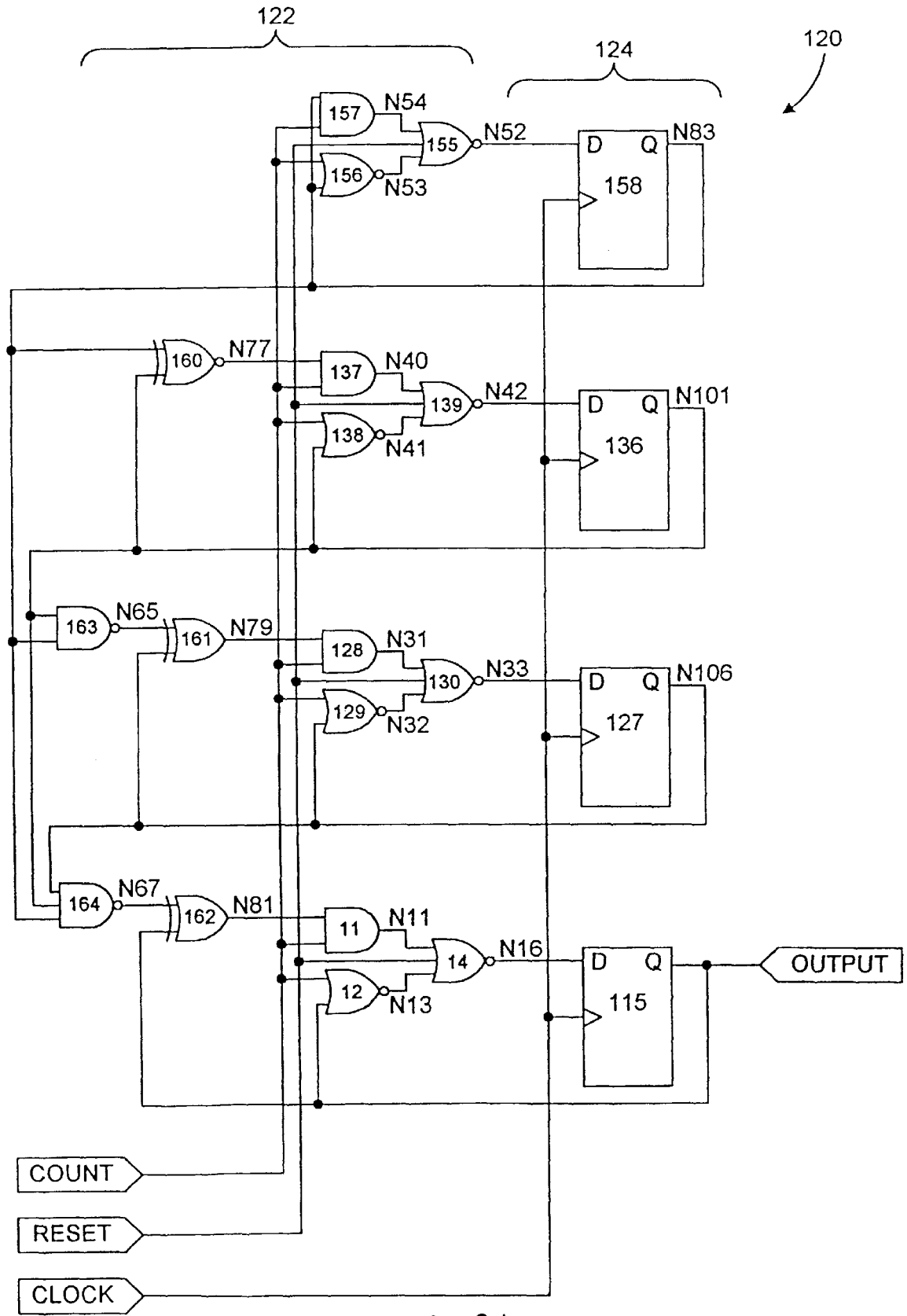
FIG. 2A shows a simple binary counter used as an example to illustrate the operation of the present invention.

Next, FIG. 2A is discussed as a specific example of a circuit design that is emulated and traced using the system of the present invention.

In FIG. 2A, circuit design 120 is shown. Circuit design 120 is a simple binary counter of 4 bits in width. The most significant bit of the counter is the output of D-flipflop I15 labeled OUTPUT. Inputs to circuit design 120 are COUNT and RESET and a system clock, CLOCK, is provided. Circuit design 120 has four D-flipflops labeled I58, I36, I27 and I15. The outputs of the D-flipflops are, respectively, N83, N101, N106 and OUTPUT. Combinatorial logic is shown to the left of the D-flipflops as an interconnection of discrete gates.

Circuit design 120 of FIG. 2A is a very simple circuit used here to illustrate the tracing system of the present invention. In practice, the present invention would be used in the emulation and tracing of a circuit containing thousands or tens of thousands of gates and storage elements such as latches, flip-flops, registers and memory devices. The present invention simplifies tracing a circuit by storing the states of the inputs to the circuit every clock cycle and by storing the circuit's "internal state" every clock cycle or intermittently, that is, less than every clock cycle. The internal state of the circuit includes the states of the inputs and any storage devices in the circuit. By storing the states of the inputs and the storage devices all of the other signal states in the circuit can be derived from the stored states since the other states are combinatorially generated from the stored states. Alternatively, a subset of the internal state of the circuit could be stored when it is not desired to derive every possible signal state in the circuit.

One way to store the internal state of the circuit (assuming, as here, that the inputs are also being stored) is to store the states of all of the outputs of all storage devices in the circuit. Another way to store the internal state is to store all of the inputs to the storage devices at the time they are clocked into the devices. It is also possible to store the internal state by storing less than all of the states of the storage devices if the states of the unstored storage devices can be derived from the known, stored states. Other ways of storing the internal state of the circuit are possible.

In the case of the circuit of FIG. 2A, the internal state of the circuit is determined by the states of the outputs of the D-flipflops. These are the signals at N83, N101, N106 and OUTPUT. Since, as discussed above, there are many different ways to implement a circuit design in an emulation system it is necessary to ensure that the implementation allows for the internal state of the circuit to be determined in order to practice the present invention. Further, the present invention requires that the states of the inputs be determined at every clock cycle. This latter requirement of sensing the inputs to the circuit every clock cycle is easily satisfied since inputs to the emulated circuit are typically provided by an outside source that can also be connected to the tracing system.

FIGS. 3A–D illustrate three different implementations of the circuit design of FIG. 2A. In each implementation the tracing system of the present invention must be able to sense and store the state of the inputs at every clock cycle and store the internal state of the implementation at least intermittently. These implementations are representative of many possible implementations that may be used with the tracing scheme of the present invention. In general, as long as the requirements of sensing the inputs and internal state are satisfied any implementation is adequate for use in connection with the invention.

FIG. 3A shows the implementation of circuit design 120 of FIG. 2A in a general purpose computer. In FIG. 3A computer system 160 includes CPU 162, I/O 164 and memory 166 interconnected by a bus 168. Memory 166 is shown containing program code and data. These components form a "digital system" suitable for emulating the circuit design. The circuit design 120 of FIG. 2A is implemented within computer system 160 by software residing within memory 166. The software is executed by CPU 162. Inputs and outputs are through I/O port 164. Other computer system configurations are possible.

In FIG. 3A, program 170 includes a description of the logic functions in circuit design 120. Program 170 is a combination of executable code and data that defines the logic functions of circuit design 120. Trace buffer 172 is a portion of memory that is used to store state information generated by the execution of program 170 by CPU 162. Memory locations 174 are four specific locations used to store the state of each of the D-flipflops in circuit design 120. Thus, the state of the signal, OUTPUT, for D-flipflop I58 is shown to be 0. The states for I36, I27 and I15 are, respectively, 1, 1 and 0. During the course of emulating circuit design 120, locations 174 are updated with the current state of the D-flipflops. The contents of locations 174 are copied into trace buffer 172 as needed by the tracing system. Code for accomplishing the copying resides in memory 166 and can be part of program 170. The states of the input signals COUNT and RESET may be sensed by having the CPU read I/O port 164 and storing the status of the bits in I/O port 164 in trace buffer 172 in a manner that is commonly known in the art.

Thus, the implementation of circuit design 120 in a general purpose computing system as shown in FIG. 3A provides for tracing both the states of the inputs and the internal state of the circuit as required by the tracing system of the present invention.

FIG. 3B shows an implementation of circuit design 120 in FPGAs. Normally, a circuit as simple as circuit design 120 would simply be formed on a breadboard for further testing. However, for purposes of illustration we show circuit design 120 implemented into simplified FPGAs as shown in FIG. 3B. Each FPGA has inputs and a clock shown as COUNT, RESET and CLOCK. There are two signals arranged vertically between the top and bottom FPGA for a total of five interconnections in each FPGA. The top FPGA has outputs N83 and N101. These outputs correspond to the nodes shown in FIG. 2A of the same name. Bottom FPGA has outputs N106 and OUTPUT. These correspond to the node and output in FIG. 2A of the same name.

Each FPGA implements roughly half of circuit design 120. The gate arrangements and interconnections within the FPGAs need not be identical with those shown in circuit design 120; however, the logical functions implemented in the FPGAs will be identical to those of circuit design 120 with respect to the inputs and output of the circuit.

As can be seen from FIG. 3B, the implementation makes the inputs, namely, CLOCK, COUNT and RESET, available at every clock cycle. Also, the internal state of the circuit is available since each of the D-flipflop outputs are provided on pins N83, N101, N106 and OUTPUT.

Figure 3C:
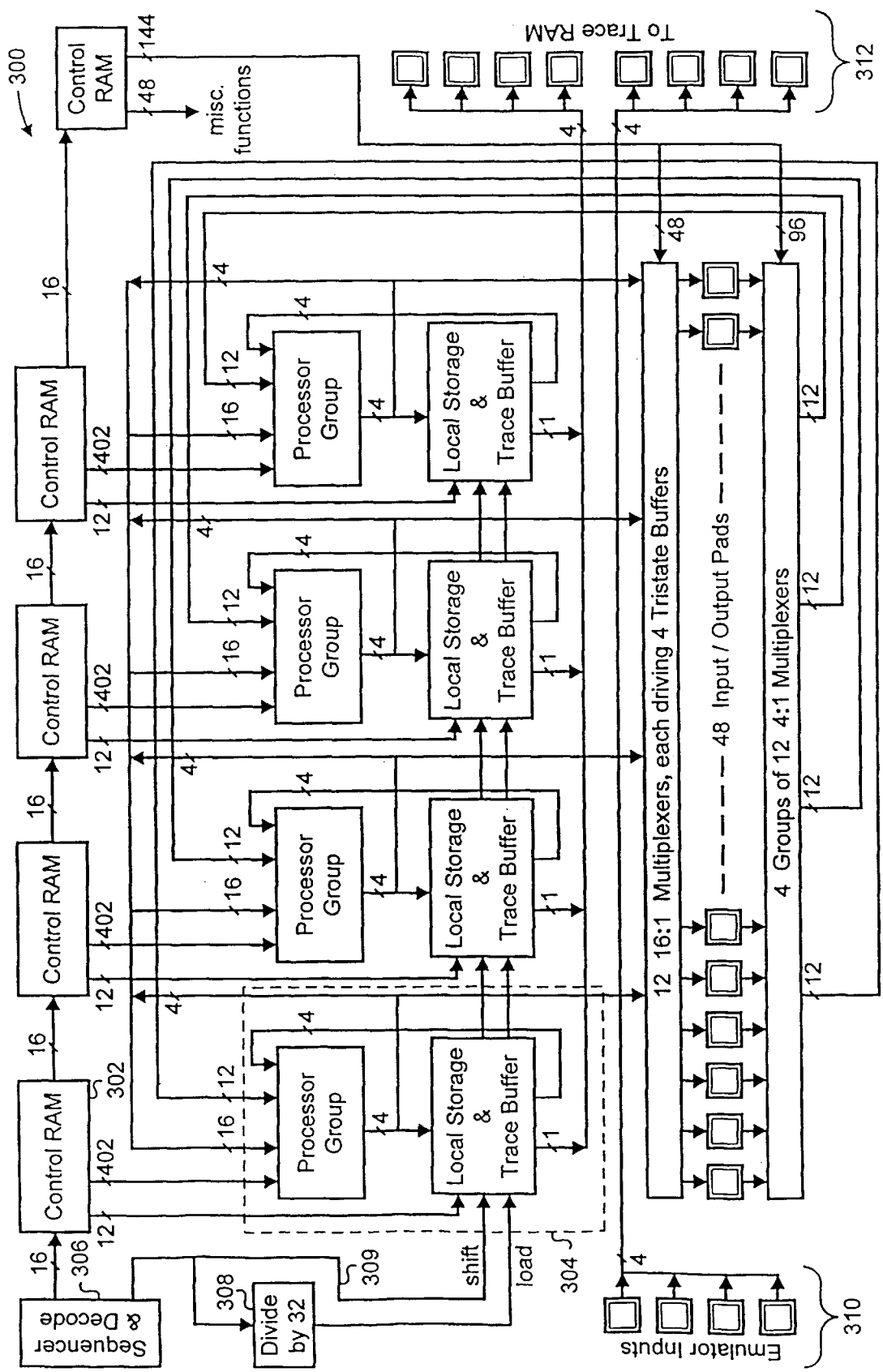
FIG. 3C is a block diagram of a multiprocessor array capable of a third implementation of a circuit design in an emulation system.
Figure 3D:
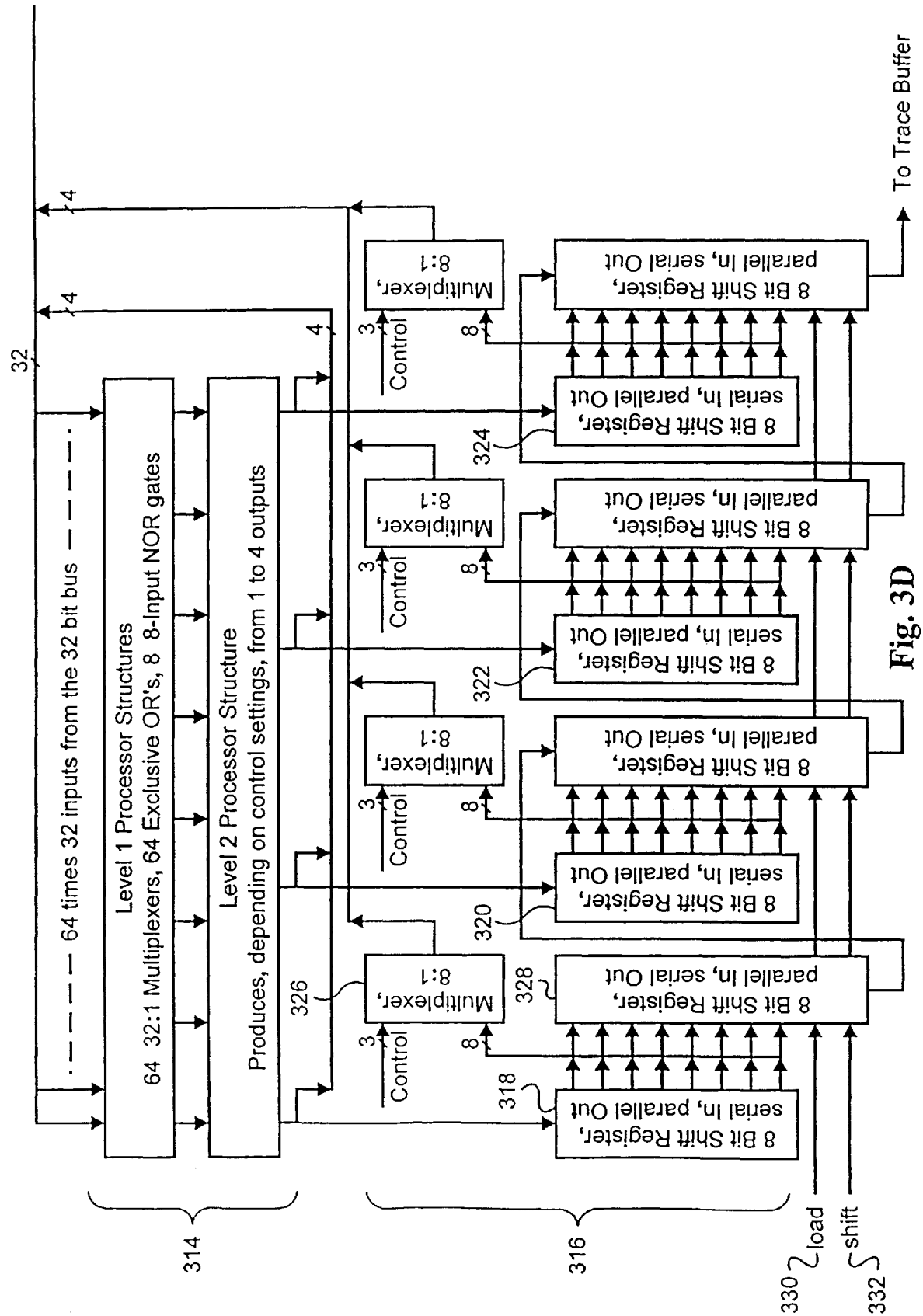
FIG. 3D is a more detailed block diagram of some of the subsystems of the multiprocessor array of FIG. 3C.

FIGS. 3C and 3D show portions of a chip used in a custom multiprocessor array capable of another implementation of circuit design 120. FIG. 3C shows the basic subsystems of the multiprocessor array architecture as blocks. In a preferred embodiment, the circuit of FIG. 3C is fabricated on a single chip and multiple chips may be arranged into a larger multiprocessor array. Signal paths to the trace buffer or random access memory (RAM) are also shown. FIG. 3D is a more detailed block diagram of some of the subsystems of FIG. 3C, including the tracing connections.

In FIG. 3C, multiprocessor array 300 includes control RAM, such as control RAM 302, for controlling the operation of processing subsystems in the array such as processing subsystem 304. The logic of a circuit design being emulated is computed by a processor group using local storage as shown by blocks within processing subsystem 304. Multiprocessor array 300 uses an emulation clock generated by sequencer 306 and a load signal derived from the clock by divider 308. Both the emulation clock and the load signal are used to capture trace information as described below.

As the circuit design is emulated by the processor subsystems, trace information is saved according to the present invention. That is, storage devices in the circuit design are emulated and their states are sampled and saved by providing the state information at pads 312 which are connected to an external trace RAM (not shown). In addition to the storage device states, the inputs used by the multiprocessor array are stored in the external trace RAM as shown by the signal paths from pads 310 to pads 312. Some components and connections have been omitted from FIG. 3C for ease of explanation. Notably, there are additional components and signal paths for allowing the signal inputs at 310 to be used as inputs to the multiprocessor array that are not shown in FIG. 3C.

FIG. 3D shows more details of processing subsystem 304, in FIG. 3C. As with FIG. 3C, FIG. 3D omits structure and interconnections that are not directly relevant to the present invention. In FIG. 3D, the processor group is at 314 while local storage and control, along with tracing components, is shown at 316. Each processing subsystem includes four shift registers such as shift registers 318, 320, 322 and 324. Each shift register is configured similarly.

For example, shift register 318 has its serial input connected to the processor group hardware so that it can receive information about the internal state of the circuit design being emulated (or, equivalently, the state of processing components in the multiprocessor array) as a single bit of information. The state information is stored under the control of signals generated by the control RAM. The control RAM outputs signals according to data words stored within it. The data is predetermined at a compile step in order to accurately emulate the circuit design. The designer can alter parameters at the compile step so that the type and frequency of state information that is loaded into shift registers such as 318, 320, 322 and 324 is adjustable.

Shift registers 318, 320, 322 and 324 are clocked by the system clock cycle. Thus, the registers contain the logic level of the processor outputs in the previous 8 clock cycles. The 8 to 1 multiplexers, such as multiplexer 326, allow selection of the appropriate bit. This differs somewhat from typical computer architecture designs where both storing and retrieving intermediate results is done selectively. By storing all information, at least for a limited time, fewer control signals are required.

Once state information is in the shift register it may be re-routed to the processor group via multiplexer 326, again under the control of signals from the control RAM. At predetermined times, the state information in the shift registers is loaded into an 8-bit parallel in/serial out shift register (referred to here as a "parallel in shift register"). For example, FIG. 3D shows that the state information in shift register 318 is loaded into parallel in shift register 328 according to load signal 330. Once a parallel in shift register is loaded, the state information is shifted out according to shift signal 332.

Note that all parallel in shift registers in FIG. 3D are cascaded so that they, in effect, form a 32 bit parallel in/serial out shift register that feeds to an output pad to the trace RAM. In a preferred embodiment, the parallel in shift registers are loaded every 32 emulated clock cycles and their data is shifted each emulated clock cycle. Therefore, since the components of FIG. 3D are duplicated four times, one for each processing subsystem of FIG. 3C, four bits of trace data are available each emulated clock cycle at the four pads shown at 312 of FIG. 3C connected to the processing groups. The trace information is also stored each emulated clock cycle so that the four bits of trace data are stored along with four bits of input signal data from the emulator inputs at pads at 310 in FIG. 3C.

Thus, FIGS. 3C and 3D illustrate how tracing of the internal state of a circuit design according to the specialized architecture of multiprocessor array 300 is achieved.

In each of the three implementations discussed above, the circuit design of FIG. 2A is changed as necessitated by the implementation. The implemented circuit may not have all of the signals and nodes that are present in the circuit design. Additional signals and nodes not present in the circuit design may also be present in the implemented circuit.

Figure 2B:
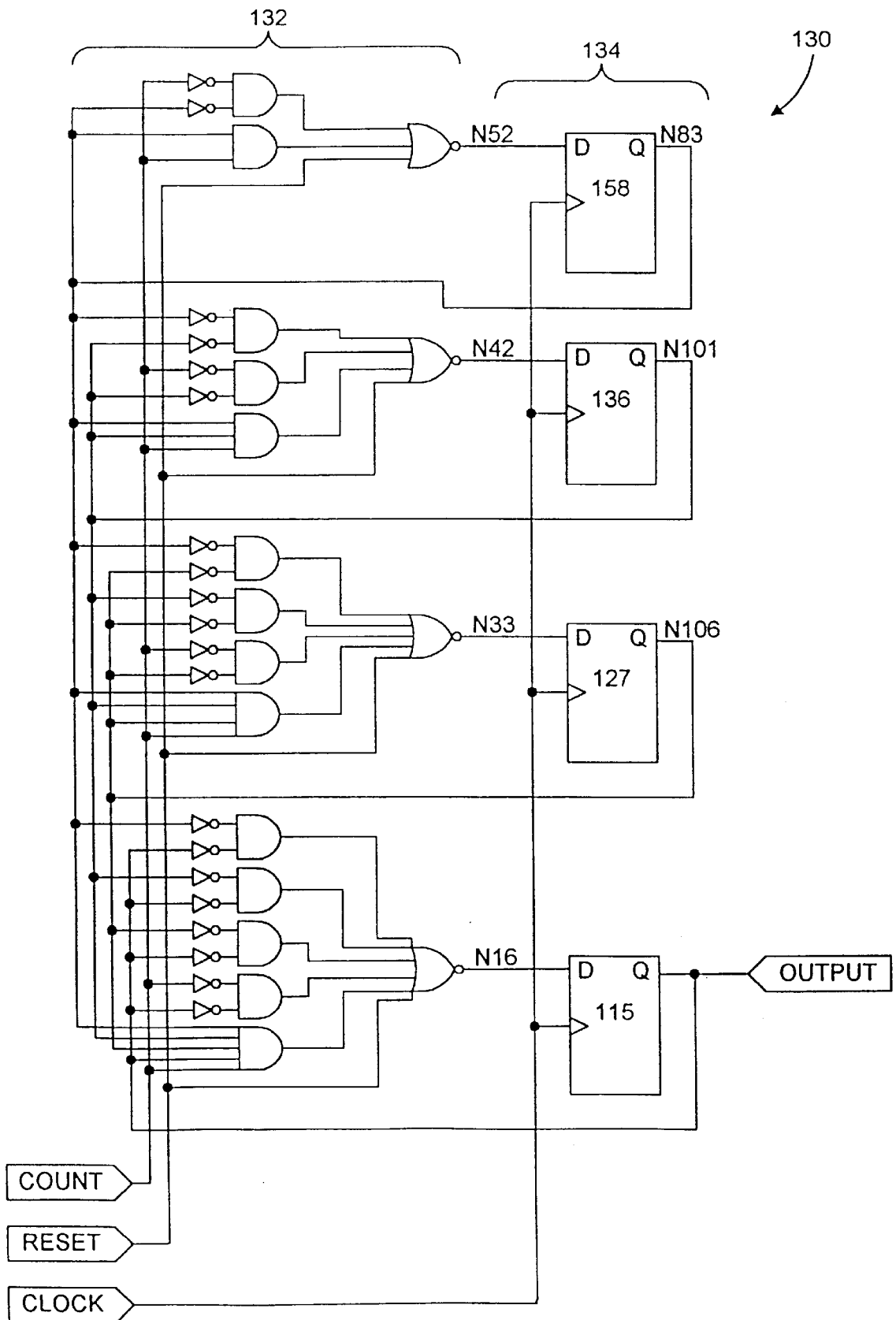
FIG. 2B shows an implementation of the circuit of FIG. 2A.

To illustrate this, FIG. 2B shows an implementation 130 of the circuit of FIG. 2A. In FIG. 2B, combinatorial gates at 132 duplicate the logic of combinatorial gates at 122 in circuit design 120 of FIG. 2A. Note that while nodes N52, N42, N33, N16, N83, N101, N106 and OUTPUT are preserved in implementation 130, certain nodes in circuit design 120 such as N77, N79, etc., are omitted from implementation 130. Even though the schematic diagrams for circuit design 120 and implementation 130 differ, both accomplish the same logical functions and for most emulation purposes are therefore identical.

Even though three specific implementation methods for emulating the circuit design of FIG. 2A have been shown with respect to the discussion corresponding with FIGS. 3A, 3B and 3C, any implementation scheme which allows for the inputs to be sensed every clock cycle and that allows for the internal state of the circuit to be sensed intermittently during the emulation is suitable for operation with the present invention as discussed below.

Figure 4:
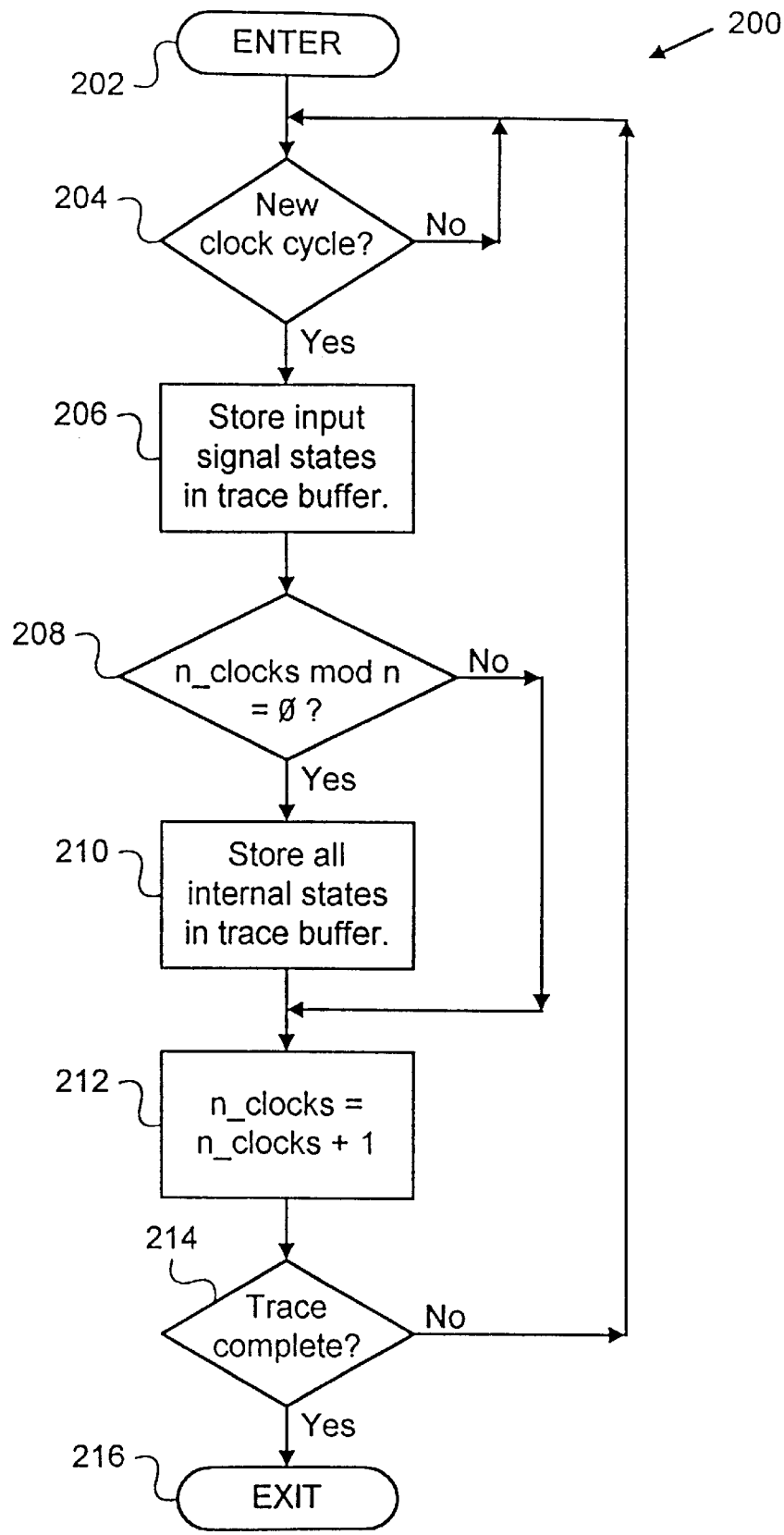
FIG. 4 shows a flowchart for a routine that performs sensing and storing of trace information in the present invention.

FIG. 4 shows a flowchart 200 for a routine that performs sensing and storing of trace information in the present invention.

All flowcharts presented in this application are but illustrative of the broad logical flow of steps performed in the invention. The flowchart may be implemented by a combination of hardware and software of which many different configurations and types are possible. Where software is used many computer languages as are commonly known in the art may be employed. In some embodiments, additional steps may be included to those steps illustrated by the flowcharts. Alternatively, steps may be omitted from the flowcharts without departing from the scope of the invention. The flowcharts may be implemented as one or more routines, modules, subroutines, etc. For ease of discussion, the flowchart will be referred to as being implemented by a single routine.

Prior to invoking or entering flowchart 200 at step 202, the variable "n_clocks" is set to 0 and an integer value is assigned to the variable "n". In a preferred embodiment, n is set to 32.

After the routine of flowchart 200 is entered at step 202, execution proceeds to step 204 where a test is made as to whether a new clock cycle has begun. This is determined by sensing the state of signal 309 of FIG. 3C. If it is not the start of a new clock cycle, execution returns to step 204 so that, in effect, processing remains at step 204 until the next clock cycle begins. Assuming the start of a new clock cycle, execution proceeds to step 206 where the states of the input signals are stored in the trace buffer. Next, step 208 is executed where a test is made as to whether n_clocks is an integral multiple of the value n. The first time that step 208 is executed, the value of n_clocks, as described above, is RESET to 0 so that n_clocks is an integral multiple of n, the integer being 0, so that execution proceeds to step 210.

At step 210, all of the internal states of the circuitry are stored in the trace buffer. Step 212 is next executed.

At step 212, the value of n_clocks is incremented. Step 214 is next executed which checks whether the trace has been completed. The criterion for determining the trace complete may be the execution of a break point, the detection of a predetermined value on a number of trace inputs, etc. Usually, this condition is determined by the designer who is performing the trace. Assuming the trace is not complete, execution continues at step 204 where the beginning of the next clock cycle is awaited.

The second time through the loop of steps 204–214 n_clocks has the value 1 since it was incremented at step 212. Once the next clock cycle begins, execution proceeds to step 206 where the input signal states are again stored in the trace buffer. At step 208 the value of n_clocks is compared with the value of n to determine whether n_clocks is an integral multiple of the value n. Since n_clocks now=1 and n remains 32, this condition is no longer true so execution proceeds to step 212 where the value of n_clocks is incremented again. Note that step 210, the step of storing all the internal states in the trace buffer, has been skipped. Thus, the internal states are only stored once every n clock cycles. Execution proceeds to step 214 where the loop of steps 204–214 is continued until the trace is complete. Once the trace is complete, the routine of flowchart 200 exits at step 216.

From the above discussion of the flowchart 200 of FIG. 4, it is apparent that the input signal states are stored every clock cycle while the internal states are stored in the trace buffer every n clock cycles.

Figure 5A:
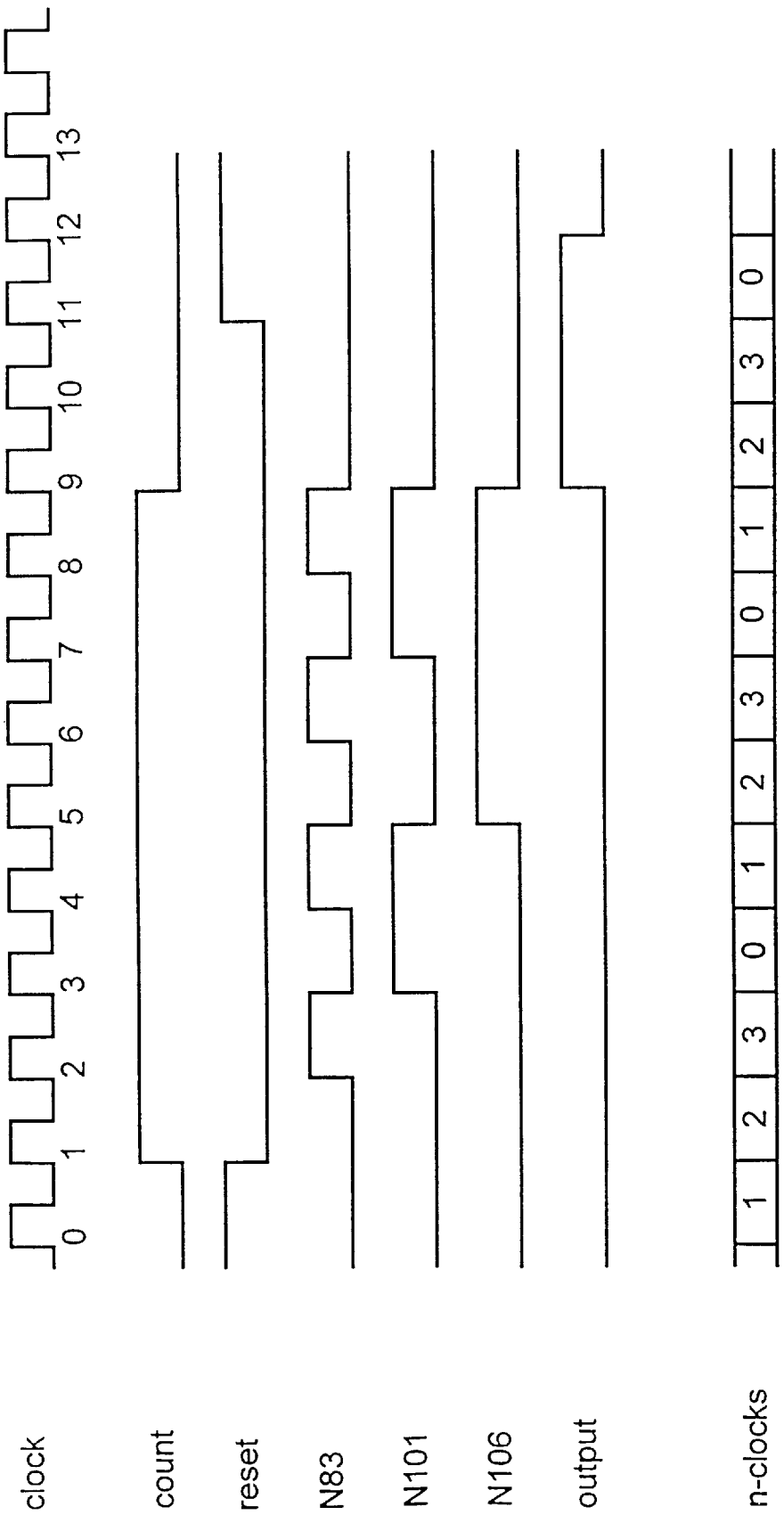
FIG. 5A is a timing diagram of signals in the circuit of FIG. 2A.

FIG. 5A is a timing diagram showing signals in the circuit design 120 of FIG. 2A. FIG. 5A shows signals that must be provided to the tracing system of the present invention. Thus, signals CLOCK, COUNT, RESET, N83, N101, N106 and OUTPUT are all provided to the tracing system to allow the tracing system to sense the inputs and the internal state of circuit design 120 as needed.

The following discussion follows the method presented by the flowchart of FIG. 4 as discussed above. The implementation of the circuit of FIG. 2A in an emulation is ignored. That is, it is assumed that the nodes of FIG. 2A are mapped to nodes in an implemented circuit so that the states of the nodes can be sampled.

As seen in FIG. 5A, signal CLOCK is a square wave whose leading edge serves to activate the D-flipflops in the circuit 120 of FIG. 2A. In the timing diagram of FIG. 5A, n_clocks has the value as shown by the numbers beneath each clock cycle in the row labeled n-clocks. The value n is set to 4 throughout this discussion. The input states are shown below clock cycles as, for example, the first input state at CLOCK 0 of 01. Internal states are similarly shown as, for example, 0010 corresponding to CLOCK 3.

Beginning with the signals as shown in FIG. 5A at CLOCK 0, the method of flowchart 200 of FIG. 4 causes the input states to be stored in the trace buffer according to step 206. In a preferred embodiment, the test at step 208 of FIG. 4 is implemented by having n_clocks be a modulo n counter that is incremented once every clock cycle. So, for this example, the test at step 208 is true whenever n_clocks reaches the value 4. At this point, since n_clocks=1, the test fails so the internal state is not stored.

FIG. 5B is a table showing state values corresponding to the timing diagram of FIG. 5A. Note that for CLOCK 0, n_clocks=1, the input states are 01 and the input to the trace buffer is 01. The value 01 for the input states indicates that the COUNT signal is low and the RESET signal is high. In other words, the first digit of the input state is the state of the COUNT signal for the clock and the second, or least significant digit, is the state of the RESET signal for the same clock. The internal state is shown as 0000 but, since the internal state is not stored at this clock cycle the temporary buffer is empty and does not reflect this.

In a preferred embodiment, the temporary buffer is the parallel-in shift register chain as discussed above in connection with FIG. 3D. The use of the temporary buffer is explained below.

The next two clock cycles, where n_clocks is incremented to 2 and 3, proceed similarly as with the first clock cycle, CLOCK 0, where n_clocks=1, in that only the input state is stored in the trace buffer. When n_clocks=4 at CLOCK 3 the test at step 208 returns true because n_clocks=n. The value of n_clocks is reset to 0 and the internal state of the circuit is stored.

Step 210 is executed to store the internal state. As shown in the table of FIG. 5B, the internal state 0010 is stored in the temporary buffer. The internal state relates to the states of OUTPUT, N106, N101 and N83, in the order of most significant bit to least significant bit. The states are sampled sometime between the active clock cycle edges.

For n_clocks=1, 2 and 3, the result of step 208 of FIG. 4 is to bypass step 210 since these values of n_clocks are not an integer multiple of 4, the value of n. Thus, only the input states are stored in the trace buffer as shown in FIG. 5B at locations of the trace buffer corresponding to clocks 0, 1 and 2.

At CLOCK 3, n_clocks=4 and the internal state is stored in a temporary buffer. Also at CLOCK 3, the input state 10 and the first, or most significant bit, of the internal state 0010 is stored in the trace buffer. Only one bit, the most significant bit, of the internal state is stored as the least significant bit in the trace buffer entry. Thus, the system is using the shift register scheme described above in connection with FIG. 3D where once the internal state has been stored the bits of the internal state are shifted out serially for storage in the trace buffer. The trace buffer entry for CLOCK 4 is 100 which includes the input state 10 followed by the most significant bit of the internal state, or 0.

For clocks 4, 5 and 6, successive bits of the internal state 0010 are shifted out and stored in the trace buffer along with the bits from the input state. The temporary buffer entries in the table of FIG. 5B illustrate the bits being shifted out. At CLOCK 7, n_clocks again equals 4 and is reset to 0 while the internal state is stored in the temporary buffer so that successive shifting out of the new internal state bits can continue. Thus, each clock cycle, after an initial start up of 3 clock cycles, 3 bits are stored in the trace buffer. The most significant first two bits are the input state while the least significant bit is ¼ of the internal state. This provides sufficient information in the trace buffer to allow the derivation of the state of all of the signals in the circuit according to the present invention.

This trace buffer system provides a distinct space savings over other systems. Only 3 bits per cycle are stored in the steady state operation of the buffer as compared to 6 bits were the internal state and input state to be stored each cycle. Thus, a trace buffer savings of 50% is realized. Greater savings can be realized depending on the frequency of storing the internal state. The more often the internal state is stored, the easier it is to calculate derivative signals in the circuit being simulated.

The tracing system can provide the state of any of the signals stored in the trace buffer of FIG. 5B by simply outputing them to the designer. For example, the state of the output at CLOCK 7 is determined to be 0 by consulting the internal state that was stored at that clock cycle. Each input signal's state is known at each clock cycle by looking at either of the two bits for that trace buffer entry. Internal state values may have to be mapped to find the value since the internal state value is spread out over four trace buffer entries. By performing this mapping of state values to trace buffer entries, the state of any input signal or internal state that was explicitly stored can be determined.

For signal states that aren't explicitly stored in the trace buffer, such as the state of the OUTPUT signal for CLOCK 6, the tracing system derives the value of OUTPUT based on the information stored in the trace buffer.

In order to derive the state of the OUTPUT signal, the tracing system goes back to the last stored internal states. This is at CLOCK 3 which maps to subsequent trace buffer locations having the values 100, 100, 101 and 100. Thus the internal state stored for CLOCK 3 is 0010. Three clock cycles, namely, clocks 4, 5 and 6, must be stepped through in order to reach CLOCK 6 which is the clock cycle for which the state of the OUTPUT signal is sought.

For each of clock cycles 4, 5 and 6, COUNT is high and RESET is low. This information is obtained from the input states stored in the trace buffer. Referring to FIG. 2A, circuit 120 has a three-input NAND gate I64 whose inputs are connected to N83, N101 and N106. These outputs of the D-flipflops are known to be, respectively, 0, 1 and 0 since these states were stored at CLOCK 3. Since not all of the inputs to NAND gate I64 are high, the output at N67 is high.

The output at N67 is the input to exclusive OR gate I62. The other input to I62 is the signal OUTPUT. OUTPUT is known to be 0 from the stored internal state at CLOCK 3. Thus, the OUTPUT of I62 at N81 is high.

The inputs to I1, a two-input AND gate are both high since COUNT is high according to the stored input states for CLOCK 4. Thus, the output of I1 at N11 is high. The inputs to I2, a two-input NOR gate are COUNT and OUTPUT. The states of COUNT and OUTPUT are stored in the trace buffer. Thus, it is known that one of the inputs to NOR gate I2 is high while the other is low. Therefore, the output of the NOR gate at N13 is low.

The inputs to three-input NOR gate I4 are high, low and low. Thus, the output of I4, at N16 is low. Since N16 is the input to the D-flipflop I15, the output of I15 upon the next clock cycle will be low.

In a similar manner, the states of the remaining D-flipflops at N83, N101 and N106 can be determined. This yields an internal state of 0011 for CLOCK 4.

After deriving the internal states for CLOCK 4, a similar process can be used to generate the internal states for clocks 5 and 6. This gives 0100 as the internal state for CLOCK 5 and 0101 as the internal state for CLOCK 6. Since the most significant bit of the internal state is the OUTPUT signal, the OUTPUT signal has been determined to be 0 at CLOCK 6 and the required information is presented to the designer. Even though this internal state was not stored during the trace operation described above, it has been derived. Thus, it is shown that states for signals that have not been stored in the trace buffer can be derived from the signal states and intermittently stored internal state.

It has been shown that storing the internal states intermittently conserves trace buffer storage. The tradeoff is that it takes time to derive internal states that were not stored. The time to derive internal states in emulations where the circuit design has a large number of gates can be prohibitive, resulting in a delay before results can be provided to the designer. In a preferred embodiment, the trace buffer is 32 kilobytes in size. The value n, is set to 32.

The internal state of the circuit design can be stored without storing the outputs of each storage element as long as enough information is stored to determine the complete state of the circuit. As an example, for circuit design 120 of FIG. 2A, the internal state of the circuit is known if it is known that RESET is high since this puts each D-flipflop into a reset state where the output of each D-flipflop is 0. Another example is that the signal, OUTPUT, of D-flipflop I15 can be determined by storing the state of a signal derived from OUTPUT, such as the signal at node N81. If the output of D-flipflop I27 (at N106) is known to be, e.g., 0, and N81 is sensed and stored as a 1, then OUTPUT must be a 0 to satisfy the logical constraints of NAND gate I64 coupled to exclusive-OR gate I62. Other ways of storing the internal state of a circuit rather than storing the states of each of the circuit's storage elements are possible.

In the foregoing specification, the invention has been described with reference to a specific exemplary embodiment thereof. It will, however, be evident that various modifications and changes may be made thereunto without departing from the broader spirit and scope of the invention as set forth in the appended claims. For example, various programming languages and techniques can be used to implement the disclosed invention. Also, the specific logic presented to accomplish tasks within the present invention may be modified without departing from the scope of the invention. Many such changes or modifications will be readily apparent to one of ordinary skill in the art. The specification and drawings are, accordingly, to be regarded in an illustrative rather than a restrictive sense, the invention being limited only by the provided claims.

What is claimed is:

1. A tracing system for tracing the operation of a digital circuit, the tracing system comprising:

a digital system for emulating the operation of the digital circuit, the digital system including a clock, inputs, internal signals and one or more state storage means for storing and indicating an electrical state;

implementation means coupled to the digital system for representing the logic of the digital circuit within the digital system;

input tracing means coupled to the digital system for sensing and storing the states of the inputs every clock cycle;

internal state tracing means coupled to the storage means in the digital system, for sensing and storing a state of a state storage means of the digital system every n clock cycles;

analysis means coupled to the digital system for deriving the state of one or more internal signals based on the stored internal states and the stored input states; and output means coupled to the digital system for outputing the derived states of the internal signals.

2. The tracing system of claim 1, wherein the internal state tracing means senses and stores the internal state of the digital system by storing one or more internal signal states, wherein the signal states collectively determine the state of each of the storage elements in the digital circuit.

3. The tracing system of claim 1, wherein the digital system is two or more field programmable gate arrays.

4. The tracing system of claim 1, wherein the digital system is a general purpose computer executing software.

5. The tracing system of claim 1, wherein the digital system is a multiprocessor array.

6. The tracing system of claim 1, wherein the implementation means includes compiling the digital circuit design into a compiled design including one or more boolean logic definitions.

7. The tracing system of claim 6, wherein the analysis means uses the representation of the logic of the digital circuit within the digital system, the compiled design, the stored input states and the stored internal states to derive trace information.

* * * * *